(12) United States Patent
Kim et al.

(10) Patent No.: US 12,033,948 B2
(45) Date of Patent: Jul. 9, 2024

(54) SEMICONDUCTOR PACKAGE

(71) Applicant: SAMSUNG ELECTRONICS CO., LTD., Suwon-si (KR)

(72) Inventors: Young Lyong Kim, Anyang-si (KR); Hyunsoo Chung, Hwaseong-si (KR); Inhyo Hwang, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 17/539,963

(22) Filed: Dec. 1, 2021

(65) Prior Publication Data

US 2022/0415809 A1 Dec. 29, 2022

(30) Foreign Application Priority Data

Jun. 25, 2021 (KR) .................. 10-2021-0083201

(51) Int. Cl.
*H01L 23/538* (2006.01)
*H01L 23/31* (2006.01)
*H01L 25/065* (2023.01)

(52) U.S. Cl.
CPC ...... *H01L 23/5385* (2013.01); *H01L 23/3114* (2013.01); *H01L 23/5384* (2013.01); *H01L 23/5386* (2013.01); *H01L 25/0655* (2013.01)

(58) Field of Classification Search
None
See application file for complete search history.

(56) References Cited

U.S. PATENT DOCUMENTS

| | | | |
|---|---|---|---|
| 6,229,215 B1 | 5/2001 | Egawa | |
| 6,404,062 B1 | 6/2002 | Taniguchi et al. | |
| 8,004,073 B2 | 8/2011 | Ko et al. | |
| 8,941,245 B2 * | 1/2015 | Lee | H01L 23/13 |
| | | | 257/E21.503 |
| 8,993,380 B2 | 3/2015 | Hou et al. | |
| 9,196,538 B2 * | 11/2015 | Hong | H01L 21/82 |
| 9,252,095 B2 * | 2/2016 | Kim | H01L 24/97 |
| 9,397,020 B2 * | 7/2016 | Park | H01L 23/3128 |
| 10,163,877 B2 | 12/2018 | Wang et al. | |
| 10,797,039 B2 | 10/2020 | Yang et al. | |
| 10,957,629 B2 | 3/2021 | Kim | |
| 2022/0165651 A1 * | 5/2022 | Kwak | H01L 23/49838 |

FOREIGN PATENT DOCUMENTS

JP 2014-192171 A 10/2014

* cited by examiner

*Primary Examiner* — Long Pham
(74) *Attorney, Agent, or Firm* — Fish & Richardson P.C.

(57) ABSTRACT

A semiconductor package includes a package substrate with a first vent hole, a first semiconductor chip mounted the package substrate, an interposer including supporters on a bottom surface of the interposer and a second vent hole, wherein the supporters contact a top surface of the first semiconductor chip, and the interposer is electrically connected to the package substrate through connection terminals. The semiconductor package further include a second semiconductor chip mounted on the interposer, and a molding layer disposed on the package substrate to cover the first semiconductor chip, the interposer, and the second semiconductor chip.

20 Claims, 13 Drawing Sheets

SEMICONDUCTOR PACKAGE

CROSS-REFERENCE TO RELATED APPLICATION

This U.S. nonprovisional application claims priority under 35 U.S.C. § 119 to Korean Patent Application No. 10-2021-0083201 filed on Jun. 25, 2021 in the Korean Intellectual Property Office, the subject matter of which is hereby incorporated by reference in its entirety.

BACKGROUND

The inventive concept relates generally to semiconductor packages, and more particularly, to semiconductor packages including at least one interposer.

Contemporary and emerging electronic products increasingly demand high performance, rapid operating speeds, and compact sizes. In order to better meet these demands, the number, size and/or weight of constituent parts of such electronic products must be reduced. Accordingly, many semiconductor devices integrate a number of individual components into a single semiconductor package. In one approach the so-called "interposer" has been developed to enable vertically stacking of semiconductor chips within a semiconductor package. In this regard, the interposer has proven to be simple, inexpensive and reliable component associated with the stacking of semiconductor chips.

Yet, there are a number of challenges associated with the integration of semiconductor chips and an interposer within a semiconductor package. And while electrical shorts are generally not been a problem when a flip-chip bonding techniques are used, voids may form between bumps of a semiconductor package when semiconductor chips are mounted using a flip-chip bonding technique. Accordingly, an under-fill resin layer is often formed to fill intervening space(s) between the bumps so as to prevent the occurrence of void(s).

SUMMARY

Embodiments of the inventive concept provide semiconductor packages exhibiting improved structural stability and better reliability. Other embodiments of the inventive concept provide methods of fabricating semiconductor packages that improve overall yield.

According to some embodiments of the inventive concept, a semiconductor package may include; a package substrate, wherein at least one first vent hole is centrally formed in the package substrate, a first semiconductor chip mounted the package substrate, an interposer including supporters on a bottom surface of the interposer and at least one second vent hole centrally formed in the interposer, wherein the supporters contact a top surface of the first semiconductor chip, and the interposer is electrically connected to the package substrate through connection terminals, a second semiconductor chip mounted on the interposer, and a molding layer disposed on the package substrate to cover the first semiconductor chip, the interposer, and the second semiconductor chip, wherein the molding layer fills the at least one first vent hole, the at least one second vent hole, a space between the first semiconductor chip and the interposer, and a space between the second semiconductor chip and the interposer.

According to some embodiments of the inventive concept, a semiconductor package may include; a package substrate including a third vent hole centrally formed in the package substrate and a first vent hole laterally spaced apart from the third vent hole, a first lower semiconductor chip mounted the package substrate, a second lower semiconductor chip mounted the package substrate, an interposer including first supporters on a bottom surface of the interposer contacting a top surface of the first lower semiconductor chip, second supporters on the bottom surface of the interposer contacting a top surface of the second lower semiconductor chip, and a second vent hole centrally formed in the interposer, wherein the interposer is electrically connected to the package substrate through connection terminals, an upper semiconductor chip mounted on the interposer, and a molding layer disposed on the package substrate to cover a combination of first lower semiconductor chip, the second lower semiconductor chip, the interposer, and the upper semiconductor chip, wherein the molding layer includes a first part filling the first vent hole, a second part filling a space between the first lower semiconductor chip and the second lower semiconductor chip and the interposer, and a third part filling a space between the upper semiconductor chip and the interposer.

According to some embodiments of the inventive concept, a semiconductor package may include; a package substrate including a third vent hole centrally formed in the package substrate and a first vent hole laterally spaced apart from the third vent hole, a first lower semiconductor chip mounted the package substrate, a second lower semiconductor chip mounted the package substrate, a first interposer mounted on the package substrate, including first supporters contacting a top surface of the first lower semiconductor chip, and further including a centrally-formed second vent hole, a second interposer laterally spaced apart from the first interposer, mounted on the package substrate, including second supporters contacting a top surface of the second lower semiconductor chip, and further including another centrally-formed second vent hole, a first upper semiconductor chip mounted on the first interposer above the centrally-formed second vent hole, a second upper semiconductor chip mounted on the second interposer above the another centrally-formed second vent hole, a molding layer disposed on the package substrate to cover a combination of first lower semiconductor chip, the second lower semiconductor chip, the first interposer, the second interposer, the first upper semiconductor chip and the second upper semiconductor chip, wherein the molding layer includes a first part filling the third first vent hole and extending to cover at least a portion of a bottom surface of the package substrate, a second part filling a space between the first lower semiconductor chip and the second lower semiconductor chip and the first interposer and the second interposer, and a third part filling a space between the first upper semiconductor chip and the first interposer and the second upper semiconductor chip and the second interposer, and the first interposer is electrically connected to the package substrate through first connection terminals disposed to one side of the first lower semiconductor, and is further electrically connected to the package substrate through second connection terminals disposed to another side of the first lower semiconductor, and the second interposer is electrically connected to the package substrate through third connection terminals disposed to one side of the second lower semiconductor, and is further electrically connected to the package substrate through fourth connection terminals disposed to another side of the second lower semiconductor.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay.

Figure 1:
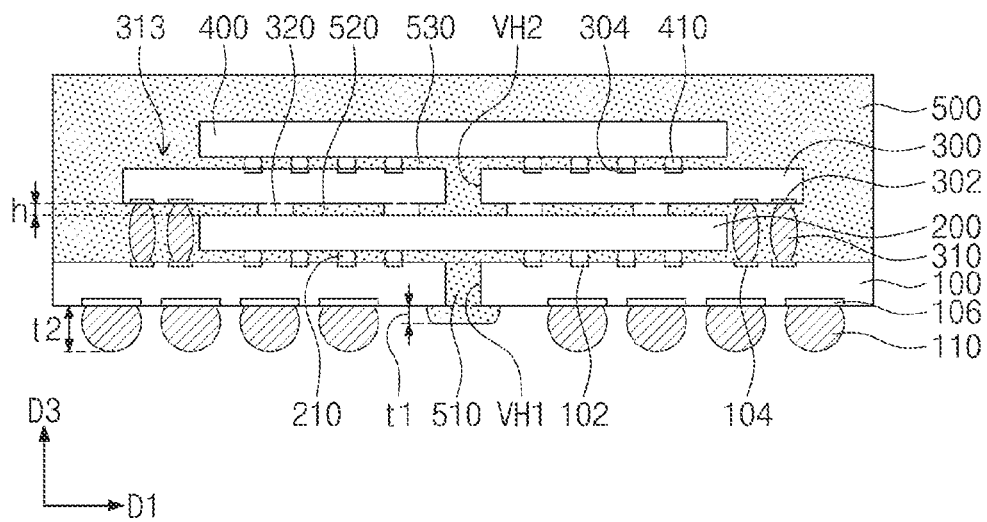
FIGS. 1 and 2 are respective cross-sectional views illustrating semiconductor packages according to embodiments of the inventive concept.
Figure 2:
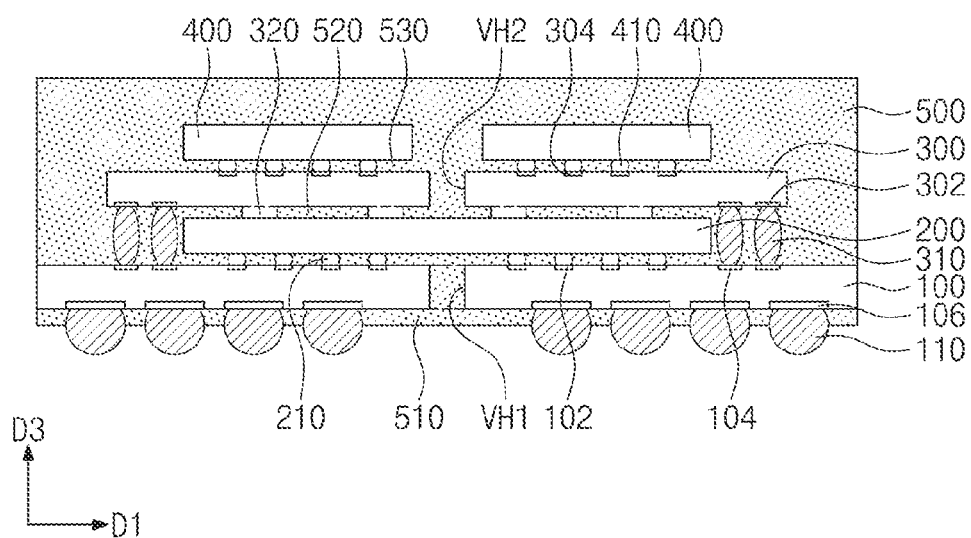
Figure 3:
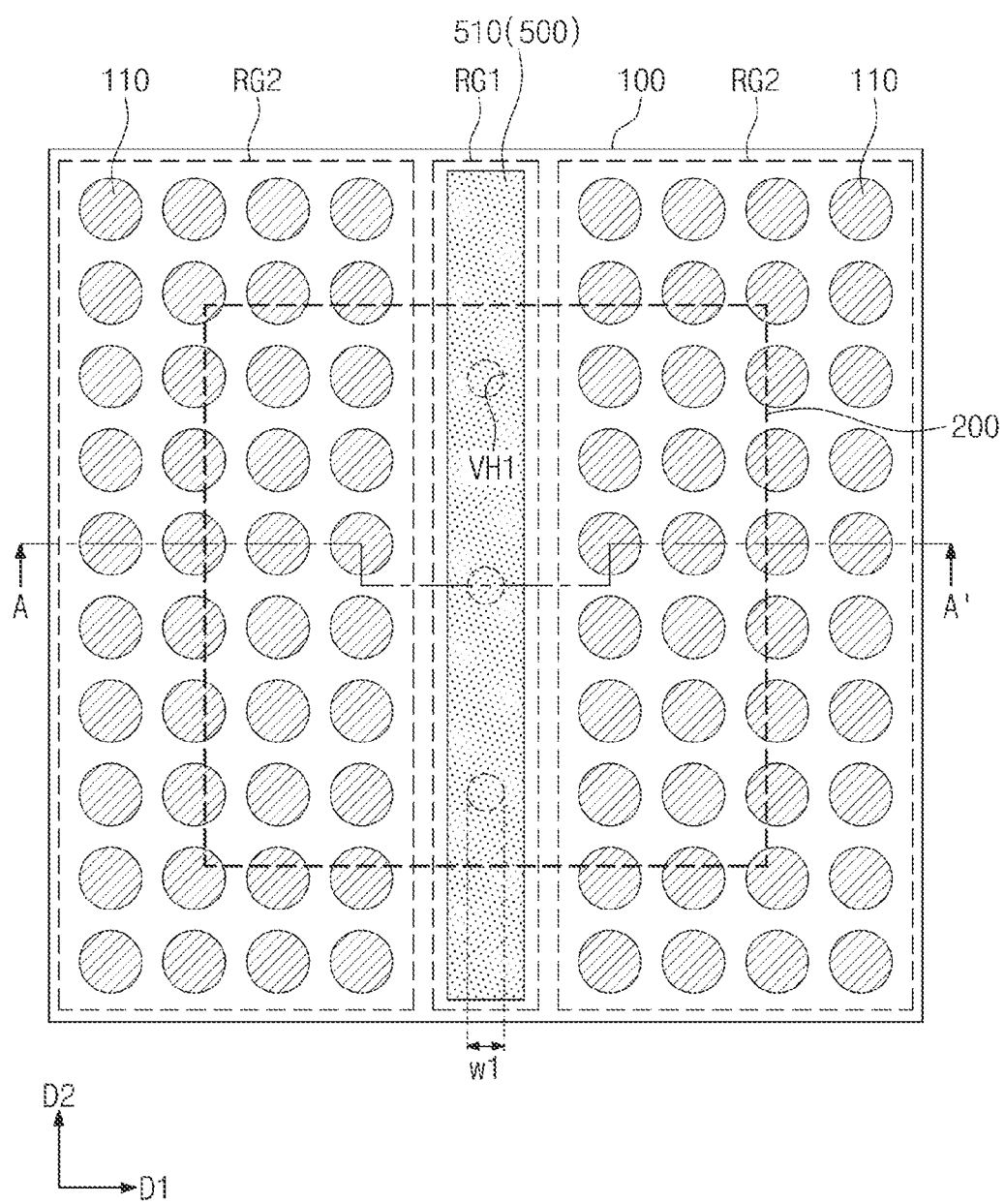
FIGS. 3, 4, 5, 6, and 7 (hereafter collectively, "FIGS. 3 to 7") are respective plan views illustrating semiconductor packages according to embodiments of the inventive concept.
Figure 4:
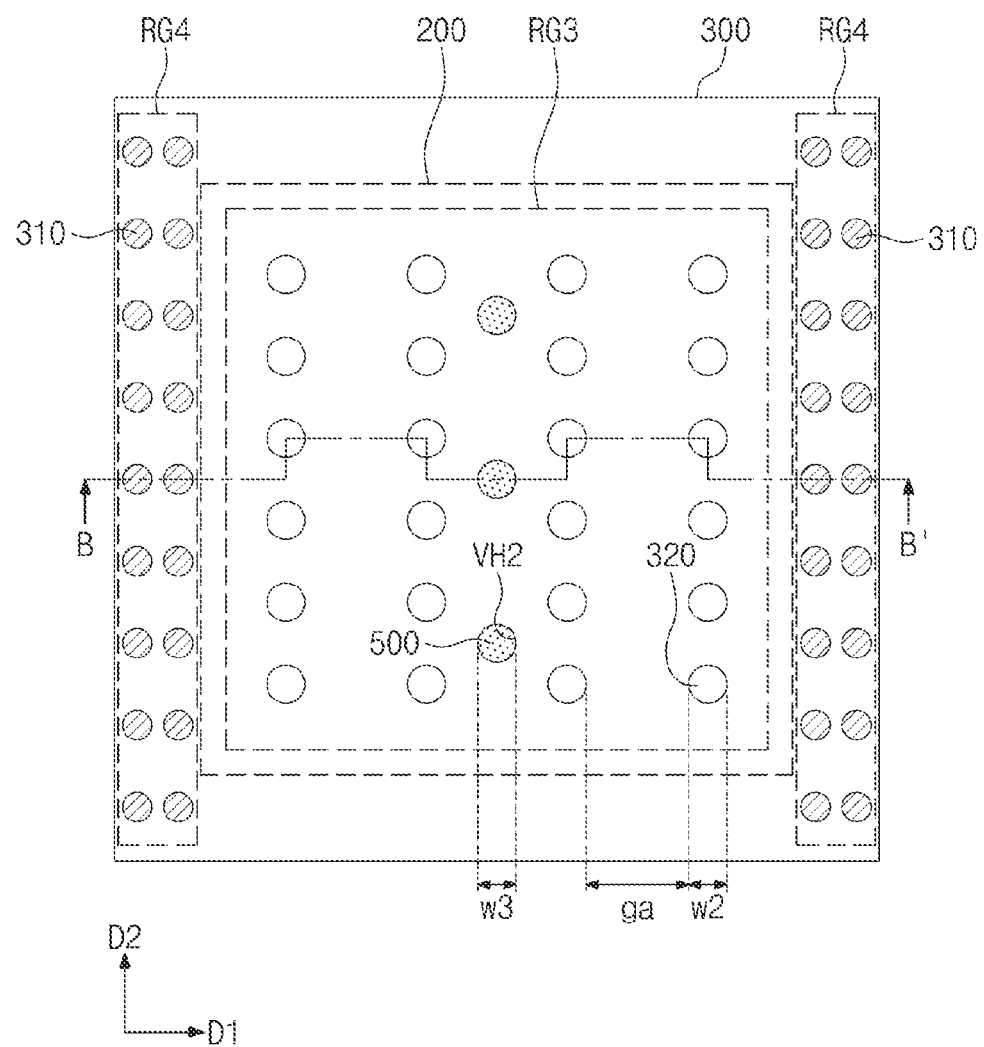
Figure 5:
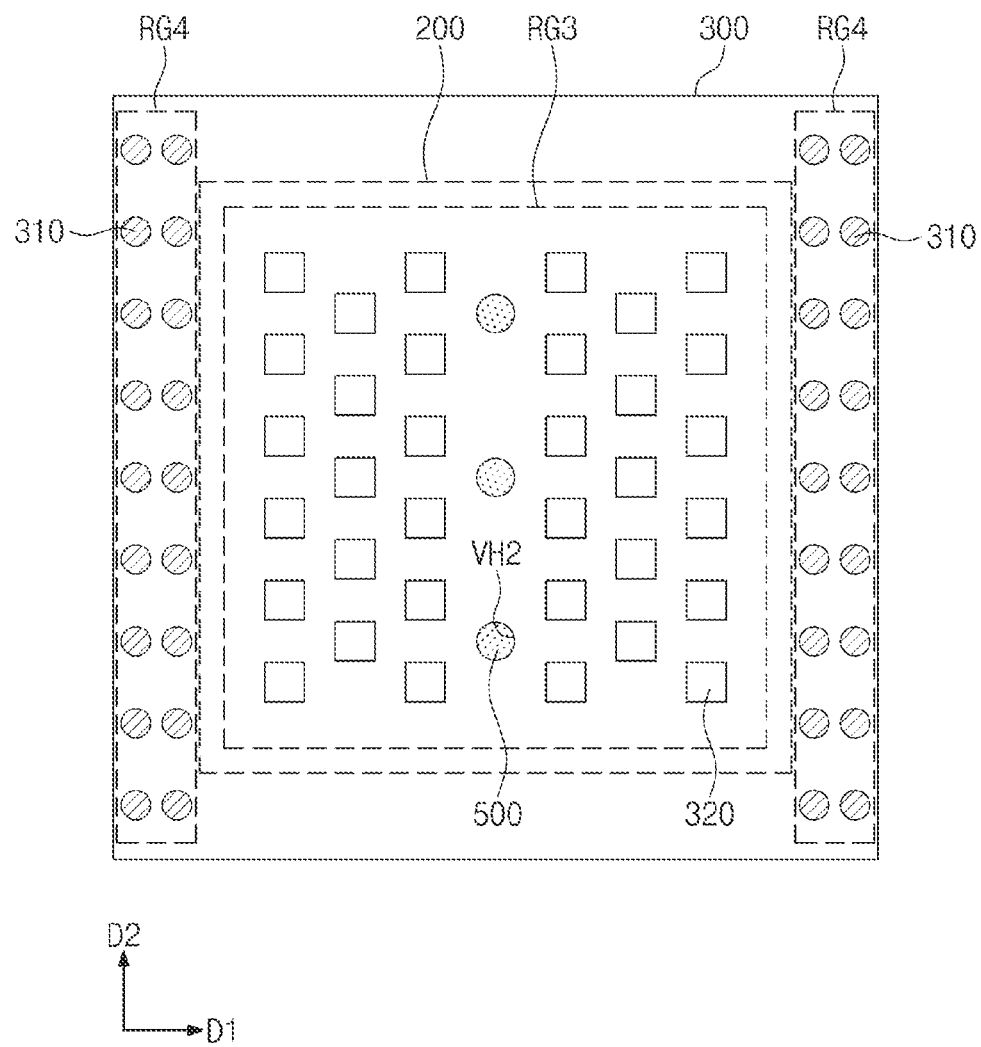

Figures (FIGS. 1 and 2 are respective cross-sectional views illustrating semiconductor packages according to embodiments of the inventive concept, and FIGS. 3, 4 and 5 are respective plan views illustrating semiconductor packages according to embodiments of the inventive concept, wherein FIG. 3 illustrates a bottom surface of a package substrate and FIGS. 4 and 5 respectively illustrate bottom surfaces of an interposer. Further in this regard, the respective cross-sectional views of FIGS. 1 and 2 may be understood as having been taken along line A-A' of FIG. 3 and/or line B-B' of FIG. 4.

Referring to FIGS. 1, 2, 3, and 4, a package substrate 100 may be a printed circuit board (PCB) including conductive patterns formed on a top surface thereof. The package substrate 100 may include a core portion, an upper buildup portion disposed on a top surface of the core portion, and a lower buildup portion disposed on a bottom surface of the core portion. Here, the upper and lower build-up portions may include wiring layers associated with various electrical connections as well as vertical connection terminals extending through (e.g., penetrating) the core portion. The package substrate 100 may include alternately stacked dielectric layer(s) and wiring layer(s). The package substrate 100 may also include first substrate pads 102 and second substrate pads 104 disposed on the top surface of the package substrate 100.

For clarity of description, embodiments of the inventive concept are described in relation to an arbitrary geometric space defined in terms of a first (horizontal) direction (D1), a second (horizontal) direction D2 intersecting the first direction D1, and a third (vertical) direction D3 intersecting both the first and second directions D1 and D2. In this regard, the primary (top and bottom) surfaces of the package substrate 100 are assumed to be respective, horizontal surfaces, and the third direction D3 is assumed to be substantially orthogonal to the horizontal surfaces.

Terminal pads 106 may be variously disposed on a bottom surface of the package substrate 100 to respectively connect external terminals 110. The terminal pads 106 may be portions of internal lines of the package substrate 100 exposed on the bottom surface of the package substrate 100. Alternately, the terminal pads 106 may be separate pads disposed on the bottom surface of the package substrate 100 and respectively connected to the internal lines of the package substrate 100. The external terminals 110 may include solder balls or solder bumps having shape(s) and arrangement consistent (e.g.) with a ball grid array (BGA), a fine ball-grid array (FBGA), or a land grid array (LGA).

In some embodiments, the package substrate 100 may include at least one first vent hole VH1 vertically penetrating the package substrate 100 (i.e., extending between the top and bottom surfaces of the package substrate 100). The at least one first vent hole VH1 may disposed in a substantially central portion of the package substrate 100.

In some embodiments, the at least one first vent hole VH1 may be disposed in a centrally-located, first region RG1 of the package substrate 100 substantially omitting external terminals 110 and separating (e.g., spacing apart) respective, second regions RG2. As shown in FIG. 3, the first region RG1 may extend in the second direction D2, and the second regions RG2 may be disposed in the first direction D1 on opposing sides of the first region RG1. That is, the first region RG1 may horizontally (or "laterally") extend in the second direction D2 between the opposing second regions RG2. Thus, the at least one first vent hole VH1 may be disposed in the first region RG1 between opposing second regions RG2 in which external terminals 110 may be variously arranged.

In some embodiments, the at least one first vent hole VH1 may have a width 'w1' (e.g., measured in the first direction D1) of about 100 μm to about 300 μm.

In some embodiments, the at least one first vent hole VH1 may include a number of first vent holes VH1 spaced apart (e.g., in the second direction D2) at regular intervals along the first region RG1. Alternately, first vent holes VH1 may be variously arranged in the first direction D1 and/or the second direction D2 (e.g., in an arrangement of columns and rows, a square lattice pattern, a grid pattern, a hexagonal lattice pattern, a honeycomb pattern, etc.). The first vent holes VH1 may be variously sized, shaped and arranged at regular or irregularity intervals according to design.

In contrast to the illustrated embodiment of FIG. 3, the first region RG1 may have an elliptically-shape and be centrally disposed in relation to the package substrate 100. Accordingly, a single second region RG2 may substantially surround the elliptical first region RG1, and the first vent holes VH1 may be arranged in a grid pattern or a honeycomb pattern within the first region RG1.

Referring to FIGS. 1, 2, 3 and 4, a first semiconductor chip 200 may be disposed on the package substrate 100. For example, the first semiconductor chip 200 may be centrally-disposed on the package substrate 100 over at least a portion of the first region RG1. At least one first vent hole VH1 may be disposed below the first semiconductor chip 200, such that at least a portion of the first semiconductor chip 200 vertically overlaps at least one of the first vent holes VH1. In this regard, the bottom surface of the first semiconductor chip 200 may directly oppose the top surface of the package substrate 100.

Thus, the bottom surface of the first semiconductor chip 200 may be an active surface, and the top surface of the first semiconductor chip 200 may be an inactive surface. It follows that the first semiconductor chip 200 may be disposed in a face-down when "mounted" (e.g., mechanically assembled and/or electrically connected) on the top surface of the package substrate 100. In this regard, the first semiconductor chip 200 may be flip-chip mounted on the package substrate 100. That is, the first semiconductor chip 200 may be electrically connected to the package substrate 100 through first chip terminals 210 (e.g., solder balls or solder bumps) disposed on the bottom surface of the first semiconductor chip 200. Here, the term "electrically connected" denotes either direct and indirect connection (e.g., connections including intervening elements and/or material(s)). In this manner, the first chip terminals 210 may be disposed between the first substrate pads 102 of the package substrate 100 and first chip pads (not shown) on the bottom surface of the first semiconductor chip 200.

The first semiconductor chip 200 may be either a memory chip or a logic chip. Here, the memory chip may include at least one of a dynamic Random Access Memory (RAM) (DRAM), a static RAM (SRAM), a flash memory, a phase-change RAM (PRAM), a resistance RAM (ReRAM), and a magnetic RAM (MRAM), and the logic chip may be (e.g.,) an application processor (AP). However, regardless of specific type, the first semiconductor chip 200 may be electrically connected through the package substrate 100 to one or more of the external terminals 110.

An interposer substrate (hereafter, "interposer") 300 may be mounted on the first semiconductor chip 200. The interposer 300 may include a dielectric substrate and/or a silicon substrate, and may be vertically spaced apart from the top surface of the first semiconductor chip 200.

In some embodiments, the interposer 300 may be variously sized and/or variously mounted with respect to the first semiconductor chip 200, such that an outer portion of the interposer 300 laterally extends beyond an outer edge of the first semiconductor chip 200. In this regard, the interposer 300 may be understood as including an overhang region 313, wherein third substrate pads 302 may be disposed on a bottom surface of the overhang region 313 and/or fourth substrate pads 304 may be disposed on a top surface of the overhang region 313. Thus, in some embodiments, the interposer 300 may include a central portion (see, RG3 of FIG. 4) bracketed (e.g., on left and/or right sides) by one or more overhang region(s) 313 (see, RG4 of FIG. 4).

However, in other embodiments, the outer edge of the interposer 300 may be vertically aligned with the outer edge of the first semiconductor chip 200. And in still other embodiments, the outer edge of the first semiconductor chip 200 may laterally extend beyond the outer edge of the interposer 300.

As noted above, the interposer 300 may be variously mounted on the package substrate 100. For example, the interposer 300 may be electrically connected through connection terminals 310 to the package substrate 100. That is, connection terminals 310 may extend between third substrate pads 302 on the overhang region 313 of the interposer 300 and second substrate pads 104 of the top surface of the package substrate 100. Here, connection terminals 310 may be disposed on one or both side(s) of the first semiconductor chip 200. The connection terminals 310 may include solder balls or solder bumps. For example, the connection terminals 310 may be solder balls each having a composite structure that includes a core, metallic portion and a peripheral portion surrounding the core portion.

In some embodiments, the interposer 300 may additionally be wire-bonded to the package substrate 100. For example, one or more of the third substrate pads 302 on the top surface of the interposer 300 may be wire-bonded to one or more of the second substrate pads 104 on the top surface of the package substrate 100.

A number of supporters 320 may be provided on the bottom surface of the interposer 300 (e.g., protruding from the bottom surface of the interposer 300). Thus, the supporters 320 may vertically extend from the bottom surface of the interposer 300 to contact the top surface of the first semiconductor chip 200, such that the supporters 320 directly support the interposer 300 on the first semiconductor chip 200.

Respective supporters 320 may include (e.g.,) a solder resist material. Respective supporters 320 may have a pillar shape (e.g., the cylindrical pillar of FIG. 4 or the polygonal pillar of FIG. 5). Respective supporters 320 may each a height 'h' (e.g., measured in the third direction D3) of about 200 μm to about 300 μm, and a width 'w2' (see, FIG. 4) of about 100 μm to about 300 μm.

In some embodiments, the supporters 320 may be regularly spaced along the top surface of the first semiconductor chip 200 according to an interval 'ga' that ranges from about 500 μm to about 1,000 μm.

In some embodiment, the supporters 320 may be variously arranged (e.g., in the first and second directions D1 and D2) within the a third (or central) portion RG3 of the interposer 300 that is bracketed on one or more sides by fourth region(s) RG4 in which the connection terminals 310 may be disposed. (See, e.g., FIG. 4).

Thus, in some embodiments like the one illustrated in FIG. 4, the supporters 320 may be arranged in columns and/or rows, a square lattice pattern, a grid pattern, etc. Alternately, in other embodiments like the one illustrated in FIG. 5, the supporters 320 may be arranged in a hexagonal lattice pattern, a honeycomb pattern, etc. However, these are just ready examples and the scope of the inventive concept is not limited thereto.

In some embodiments, a fourth regions RG4 may correspond to overhang regions 313 of the interposer 300 extending in either the first direction D1 or the second direction D2.

From the foregoing, those skilled in the art will appreciate that the supporters 320 may mechanically support the interposer 300 on the first semiconductor chip 200, thereby inhibiting or preventing warping of the interposer that may otherwise occur due to process(es) (e.g., a solder reflow process) used to mount a second semiconductor chip 400 on the top surface of the interposer 300. Further, since the respective supporters 320 are respectively separated by defined horizontal distance(s) (e.g., 'ga'), and the interposer 300 is separated from the first semiconductor chip 200 by a defined vertical distance (e.g., 'h'), a molding layer 500 may be readily formed between the interposer 300 and the first semiconductor chip 200. This process and its results will be further described in some additional detail hereafter.

In some embodiments, the interposer 300 may further include at least one second vent hole VH2 vertically penetrating the interposer 300. Here, the at least one second vent hole VH2 may be centrally disposed in the interposer 300 (e.g., within the third (or central) region RG3 of the interposer 300). That is, the at least one second vent hole VH2 may be disposed between the supporters 320 within the third region RG3.

In some embodiments, respective second vent holes VH2 may have a width 'w3' of about 100 μm to about 300 μm.

Referring to FIG. 4, second vent holes VH2 may be laterally spaced apart (e.g., in at least one of the first direction D1 and the second direction D2) at regular intervals. For example, assuming the connection terminals 310—arranged in columns extending in the second direction D2 and/or rows extending in the first direction D1 within respective fourth regions RG4 of the interposer 300—the second vent holes VH2 may be arranged in the second direction D2. In such an arrangement, the second vent holes VH2 allow molding material to easily fill space(s) between the interposer 300 and the first semiconductor chip 200 in order to form the molding layer 500. In this regard, the term "molding material" is used to denote one or more materials constituent to the molding layer 500.

In this regard, it should be noted that disposition of various connection elements within an intended flow path of molding materials may significantly impede the flow of such molding materials, particularly in the first direction D1 towards center portions of an interposer/semiconductor chip combination. Thus, embodiments of the inventive concept further facilitate the introduction of molding materials through the second vent holes VH2 in the interposer 300. This approach and its results will be describe in some additional detail hereafter.

However, it should be further noted that no limitation is imposed on the arrangement of the second vent holes VH2 which may be variously arranged (e.g.,) in columns and/or rows, a square lattice pattern, a grid pattern, a hexagonal lattice pattern, a honeycomb pattern, etc.

In some embodiments, the second vent holes VH2 may be variously disposed between and among the supporters 320. In this regard in some embodiments, a separation interval between second vent holes VH2 may be greater than the interval 'ga' between the supporters 320.

Referring to FIGS. 1 and 2, the second semiconductor chip 400 may be centrally mounted on the interposer 300 within the third region RG3, wherein at least one of the second vent holes VH2 is disposed below the second semiconductor chip 400. Thus, the second semiconductor chip 400 may vertically overlap at least one of the second vent holes VH2, such that at least one of the second vent holes VH2 is disposed between the first semiconductor chip 200 and the second semiconductor chip 400.

In some embodiments, the second semiconductor chip 400 may have a bottom surface directly opposing the top surface of the interposer 300. The bottom surface of the second semiconductor chip 400 may be an active surface, and the top surface of the second semiconductor chip 400 may be an inactive surface.

Accordingly, the second semiconductor chip 400 may be mounted on the top surface of the interposer 300 (e.g., using a flip-chip technique). For example, the second semiconductor chip 400 may be electrically connected to the interposer 300 through second chip terminals 410 (e.g., solder balls or solder bumps) disposed on the bottom surface of the second semiconductor chip 400. The second chip terminals 410 may be provided between second chip pads (not shown) on the bottom surface of the second semiconductor chip 400 and the fourth substrate pads 304 on the interposer 300.

The second semiconductor chip 400 may also be a memory chip or a logic chip.

With this configuration and regardless of specific chip type, the second semiconductor chip 400 may be electrically connected to the package substrate 100 through the interposer 300. The embodiment illustrated in FIG. 1 shows a single second semiconductor chip 400, but the scope of the inventive concept are not limited thereto and multiple second semiconductor chips 400 (e.g., vertically stacked semiconductor chips) may be mounted on the interposer 300. Here, however, multiple second semiconductor chips 400 may be spaced apart across one or more of the second vent holes VH2.

Referring to FIG. 1, the molding layer 500 may be provided on the package substrate 100 and may include one or more molding material(s). Thus, the molding layer 500 may be provided on the top surface with the package substrate 100 to substantially cover the combination of the first semiconductor chip 200, the interposer 300, and the second semiconductor chip 400. For example, the molding layer 500 may cover at least side surfaces of the first semiconductor chip 200, side surfaces of the interposer 300, side surfaces of the second semiconductor chip 400, and a top surface of the second semiconductor chip 400. In some embodiments, the first semiconductor chip 200, the interposer 300, and the second semiconductor chip 400 may be substantially embedded within the molding layer 500 on the top surface of the package substrate 100.

Further in this regard and referring to FIGS. 1 and 2, the molding layer 500 may substantially fill space(s) between the package substrate 100 and the first semiconductor chip 200. Thus, the molding layer 500 may include have a first part 510 substantially covering the bottom surface of the package substrate 100 as well as filling the space between the package substrate 100 and the first semiconductor chip 200. A portion of the first part 510 may be disposed in respective first vent holes VH1, as well as the bottom surface of the package substrate 100. Thus, in some embodiments, the first part 510 of the molding layer 500 may extend through the first vent holes VH1 of the package substrate 100 onto the bottom surface of the package substrate 100 from the space between the package substrate 100 and the first semiconductor chip 200.

The first part 510 may substantially cover the bottom surface of the package substrate 100 to a first thickness 't1' less than a second thickness 't2' of the external terminals 110 (e.g., less than a distance between the bottom surface of the package substrate 100 and a bottom surface of the external terminal 110). The resulting shape of the first part 510 on the bottom surface of the package substrate 100 (e.g., a planar spread) may depend on the arrangement of the first vent holes VH1. For example, if the first vent holes VH1 are arranged in the second direction D2 as shown in FIG. 3, the first part 510 may form with a linear shape largely extending in the second direction D2. Alternately, as shown in FIG. 2, the first part 510 may cover an entire bottom surface of the package substrate 100. In this case, the first part 510 may serve as a passivation layer that protects the bottom surface of the package substrate 100. Alternately, the first part 510 may form as one or more islands arranged (or extending) in the second direction D2 on the bottom surface of the package substrate 100. (See. e.g., FIG. 3).

Still further, the molding layer 500 may fill space(s) between the interposer 300 and the first semiconductor chip 200, and/or space(s) between the interposer 300 and the second semiconductor chip 400. Thus, in some embodiments, the molding layer 500 may have a second part 520 substantially filling space(s) between the interposer 300 and the first semiconductor chip 200, and/or a third part 530 substantially filling space(s) between the interposer 300 and the second semiconductor chip 400.

The second part 520 may substantially surround the supporters 320 between the interposer 300 and the first semiconductor chip 200, and may contact side surface(s) of the supporters 320. The third part 530 may substantially surround the second chip terminals 410 between the interposer 300 and the second semiconductor chip 400, and may contact with side surface(s) of the second chip terminals 410. In this regard, the second part 520 and the third part 530 may be connected through the second vent holes VH2.

Thus, in some embodiments, during fabrication of a semiconductor package, the second vent holes VH2 may serve as flow paths for molding material forming the molding layer 500, as the molding layer 500 is introduced between the interposer 300 and the first semiconductor chip 200, as well as between the interposer 300 and the second semiconductor chip 400. This approach and its results will be described in some additional detail hereafter. Therefore, the molding layer 500 may fill space between the interposer 300 and the first semiconductor chip 200, space between the interposer 300 and the second semiconductor chip 400, and space within the second vent holes VH2.

Figure 6:
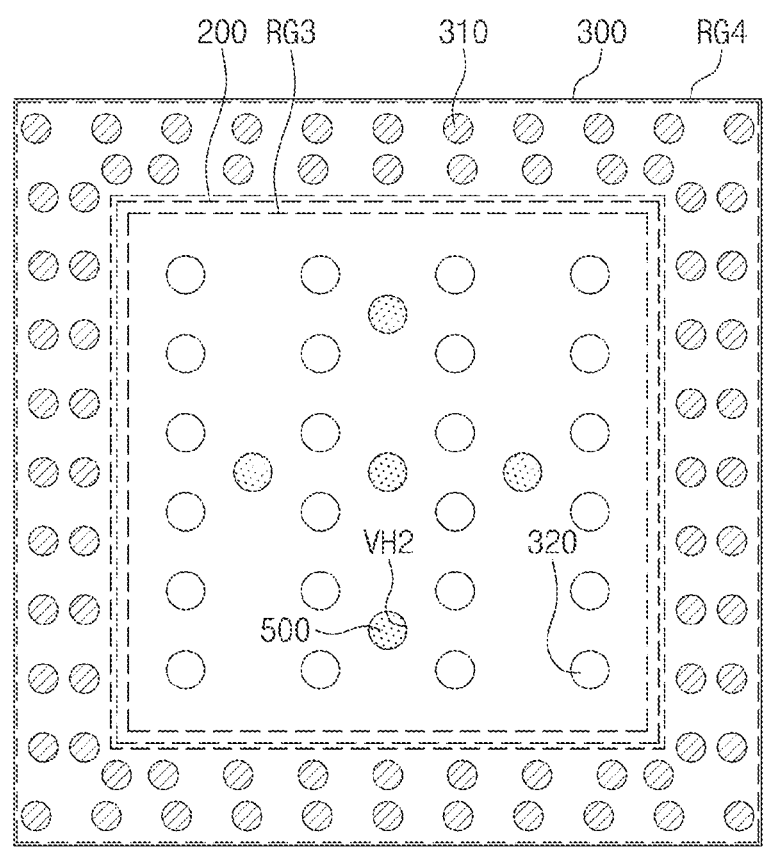
Figure 6:
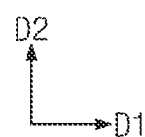
Figure 7:
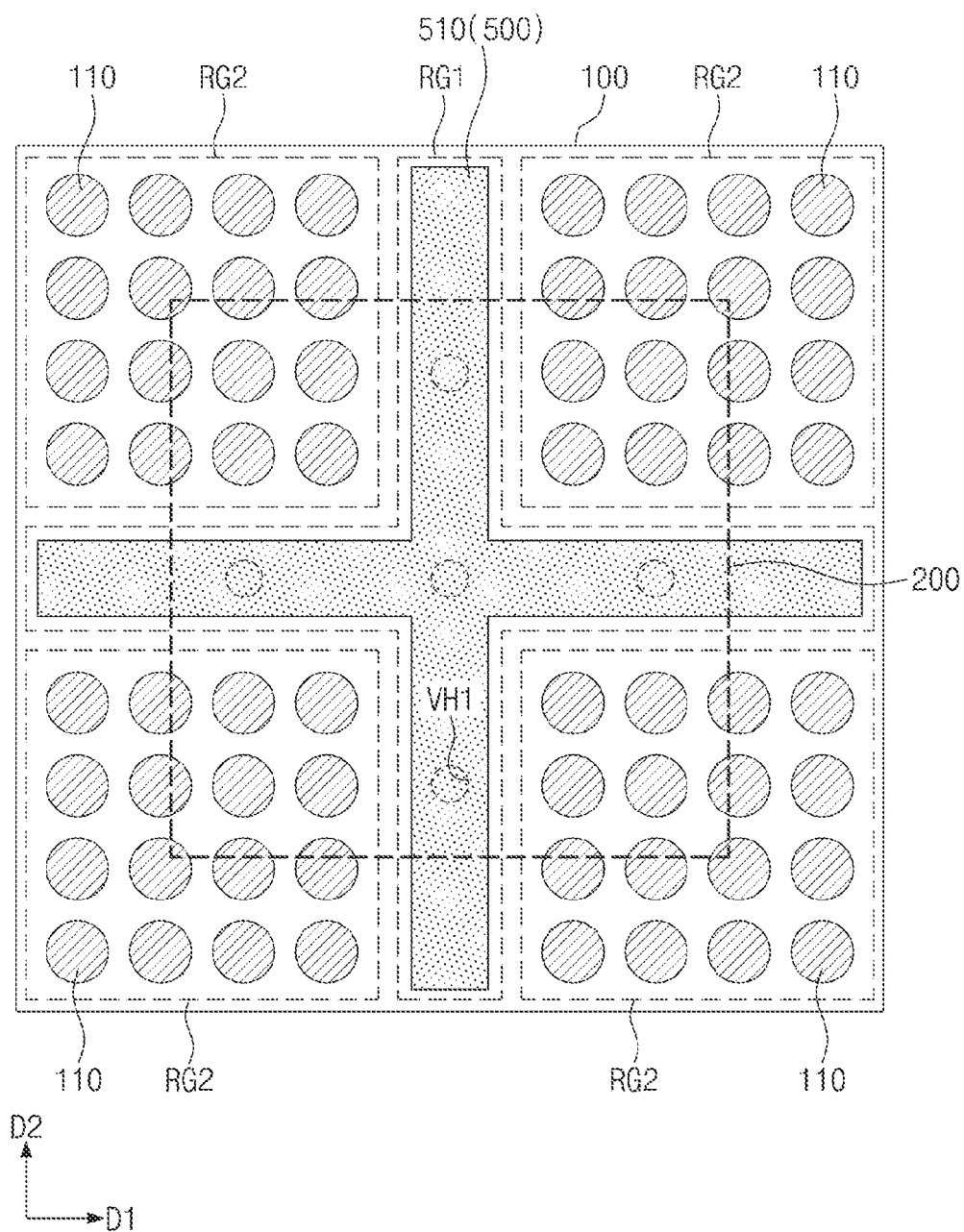

FIGS. 6 and 7 are respective plan views illustrating bottom surfaces of semiconductor packages according to embodiments of the inventive concept.

Referring to FIGS. 1, 6, and 7, the interposer 300 may again include a centrally disposed third region RG3 in which the supporters 320 may be variously arranged. However, the third region 320 may be surrounded on four (4) sides by a peripheral fourth region RG4 (e.g., extending along outer edges of the interposer 300) in which connection terminals 310 may be variously arranged.

Thus, the third region RG3 may be a central portion of the interposer 300, and in some embodiments, may correspond in lateral area to that of the first semiconductor chip 200, such that the supporters 320 may be disposed in contact with the tope surface of the first semiconductor chip 200.

As before, the interposer 300 may include second vent holes VH2 disposed within the third region RG3 of the interposer 300, and disposed between and among the supporters 320.

In the illustrated example of FIG. 6, the second vent holes VH2 are arranged in both first direction D1 and second direction D2 to form a cross pattern, as yet another example of possible arrangement patterns. Such an arrangement of the second vent holes VH2 allows molding material to easily fill space(s) between the interposer 300 and the first semiconductor chip 200 when the molding layer 500 is formed. For example, the second vent holes VH2 may be used to introduce the molding material into the third region RG3— which may be difficult to do because of the surrounding connection terminals 310. This approach and its results will be described in some additional detail hereafter.

In relation to the foregoing and referring to FIG. 7, the package substrate 100 may include a cross-shaped first region RG1 in which the first vent holes VH1 are disposed, and multiple second regions RG2 separated by the cross-shaped first region in which the external terminals 110 may be disposed. Further, as shown in FIG. 7 and assuming the first vent holes VH1 are arranged in the cross-shaped pattern of FIG. 6, the first part 510 of the molding layer 500 may be formed with a cross-shaped pattern.

Figure 8:
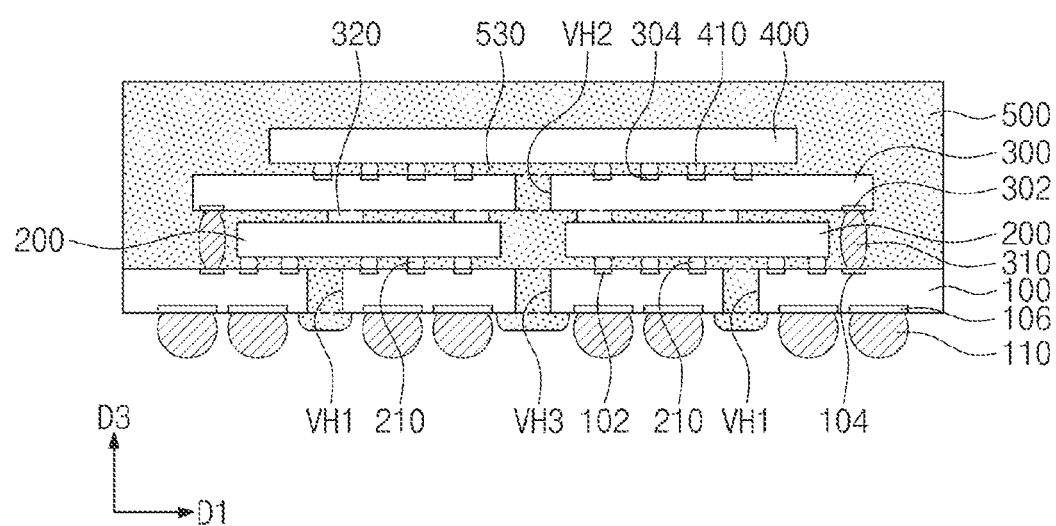
FIGS. 8 and 9 are respective cross-sectional views illustrating semiconductor packages according to embodiments of the inventive concept.

FIG. 8 is a cross-sectional view showing a semiconductor package according to embodiments of the inventive concept.

Referring to FIG. 8, multiple first semiconductor chips 200 are spaced apart and mounted on the tope surface of a central portion of the package substrate 100. First vent holes VH1 may be disposed below each one of the first semiconductor chips 200. That is, each one of the first semiconductor chips 200 may vertically overlap at least one of the first vent holes VH1. However, as previously described in relation to FIG. 3, the arrangement of first vent holes VH1 may vary by design.

The semiconductor package may further include at least on third vent hole VH3 vertically penetrating the package substrate 100, and disposed within the central portion of the package substrate 100. In some embodiments, each of the third vent holes VH3 may be disposed between the first semiconductor chips 200, and may have a width of about 100 μm to about 300 μm.

The third vent holes VH3 may be spaced apart at regular intervals in at least one of the first direction D1 and the second direction D2.

The interposer 300 may be disposed over the first semiconductor chips 200 and mounted on the package substrate 100 through the connection terminals 310. FIG. 8 shows connection terminals 310 disposed laterally outside of the first semiconductor chips 200, but the scope of the inventive concept are not limited thereto. Alternately or additionally, one or more connection terminals 310 may be disposed between the first semiconductor chips 200.

The interposer 300 may again include the supporters 320 extending from the bottom surface of the interposer 300 to contact with the top surfaces of respective first semiconductor chips 200. At least one second vent hole VH2 may be disposed in the central portion of the interposer 300 between the first semiconductor chips 200.

The second semiconductor chip 400 may be centrally disposed on the interposer 300 such that the second vent hole VH2 is disposed below the second semiconductor chip 400.

The molding layer 500 may again be provided to cover at least the combination of the first semiconductor chips 200, the interposer 300, and the second semiconductor chip 400.

Thus, the molding layer 500 may fill space(s) between the package substrate 100 and the interposer 300, extend from a space between the interposer 300 and the first semiconductor chips 200 through a space between the first semiconductor chips 200 into a space between the package substrate 100 and the first semiconductor chips 200. In addition, the molding layer 500 may extend from space between the package substrate 100 and the first semiconductor chips 200 through the first and third vent holes VH1 and VH3 onto the bottom surface of the package substrate 100.

Figure 9:
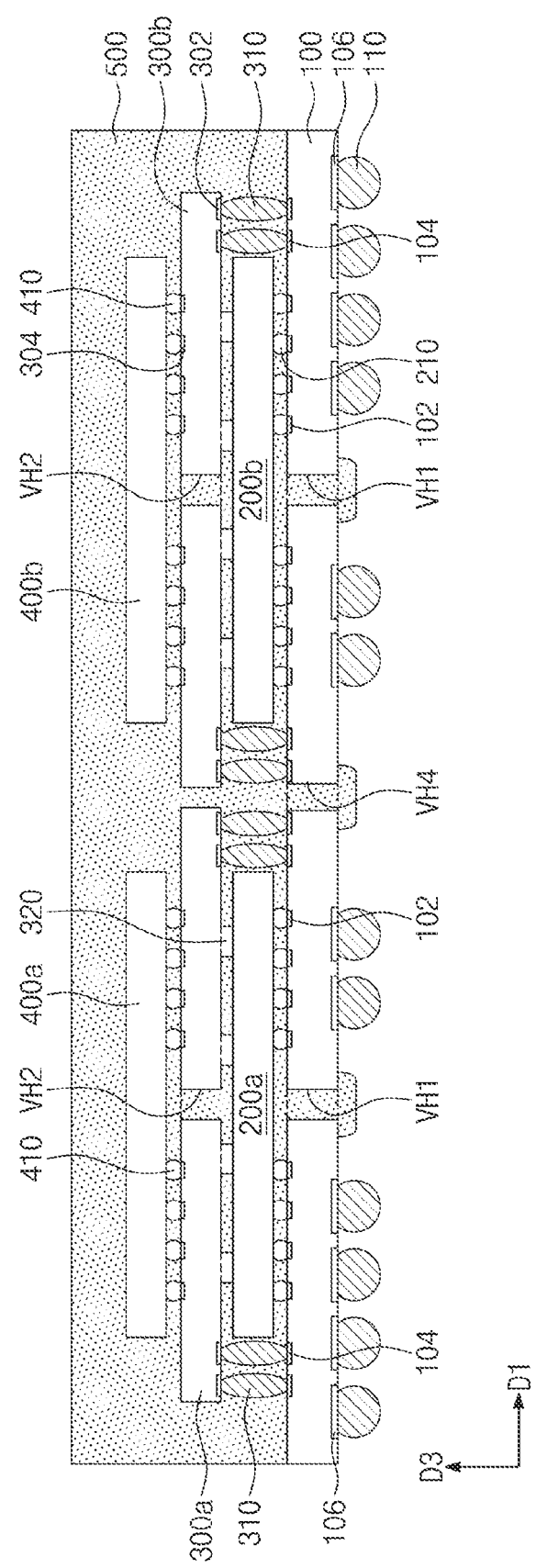

FIG. 9 is a cross-sectional view illustrating a semiconductor package according to embodiments of the inventive concept.

Referring to FIG. 9, multiple (e.g., first and second) lower semiconductor chips 200 may be mounted on the package substrate 100, and multiple (e.g., first and second) interposers 300 may be respectively disposed on the first semiconductor chips 200. Thus, in contrast to the embodiment of FIG. 8 wherein a single interposer is disposed over multiple first semiconductor chips, the embodiment of FIG. 9 includes a first lower semiconductor chip 200a and a second lower semiconductor chip 200b laterally spaced apart and mounted on the substrate package 100, as well as a first interposer 300a disposed on the first lower semiconductor chip 200a, and a second interposer 300b disposed on the second lower semiconductor chip 200b. However, this is just one possible arrangement of lower semiconductor chips and interposers, and the scope of the inventive concept is not limited thereto.

Here, the structure and arrangement of interposers 300a and 300b in relation to the lower semiconductor chips 200a and 200b may be substantially the same as that previously described in relation to FIGS. 1, 2, 3, 4, and 5.

The semiconductor package of FIG. 9 may include at least one fourth vent hole VH4 vertically penetrating from top to bottom surfaces of the package substrate 100. The at least one fourth vent hole VH4 may be centrally provided in the package substrate 100 (e.g., between the first interposer 300a and the second interposer 300b and/or between the first lower semiconductor chip 200a and the second lower semiconductor chip 200b). The at least one fourth vent hole VH4 may have a width of about 100 μm to about 300 μm.

The at least one fourth vent hole VH4 may include a plurality of fourth vent holes VH4 spaced apart at regular (or irregular) intervals in at least one of the first direction D1 and the second direction D2.

A first upper semiconductor chip 400a may be mounted on the first interposer 300a, and a second upper semiconductor chip 400b may be mounted on the second interposer 300b.

The molding layer 500 may be provided on the top surface of the package substrate 100 to substantially cover the combination of the first and second, lower semiconductor chips 200a and 200b, the first and second interposers 300, and the first and second upper semiconductor chips 400a and 400b. In some embodiments, this combination of components may be substantially embedded within the molding layer 500.

During fabrication of semiconductor packages according to the inventive concept, molding material (ultimately forming the molding layer 500) may be readily introduced into a space between the first and second lower semiconductor chips 200a and 200b and package substrate 100, a space between the first and second interposers 300 and the first and second lower semiconductor chips 200a and 200b, and a space between the first and second interposers and the first and second upper semiconductor chips 400a and 400b, wherein this introduction of molding materials is facilitated by the provision of the first vent holes VH1, the second vent holes VH2, the third vent holes VH3, and the fourth vent holes VH4, as described above.

Here, the first semiconductor chip 200a may be laterally separated from the second semiconductor chip 200b by a gap extending (e.g.,) in the first horizontal direction D1.

Further, the first interposer 300a may be electrically connected to the package substrate 100 by a first set of connection terminals 310 disposed on one side of the first lower semiconductor chip 200a, and may be further electrically connected to the package substrate 100 by a second set of connection terminals 310 disposed on another side of the first lower semiconductor chip 200a. Similarly, the second interposer 300b may be electrically connected to the package substrate 100 by a third set of connection terminals 310 disposed on one side of the second lower semiconductor chip 200b, and may be further electrically connected to the package substrate 100 by a fourth set of connection terminals 310 disposed on another side of the second lower semiconductor chip 200b.

Therefore, within this configuration, the second set and the third set of the connection terminals may be disposed in the gap laterally separating the first lower semiconductor chip 200a from the second lower semiconductor chip 200b.

Figure 11:
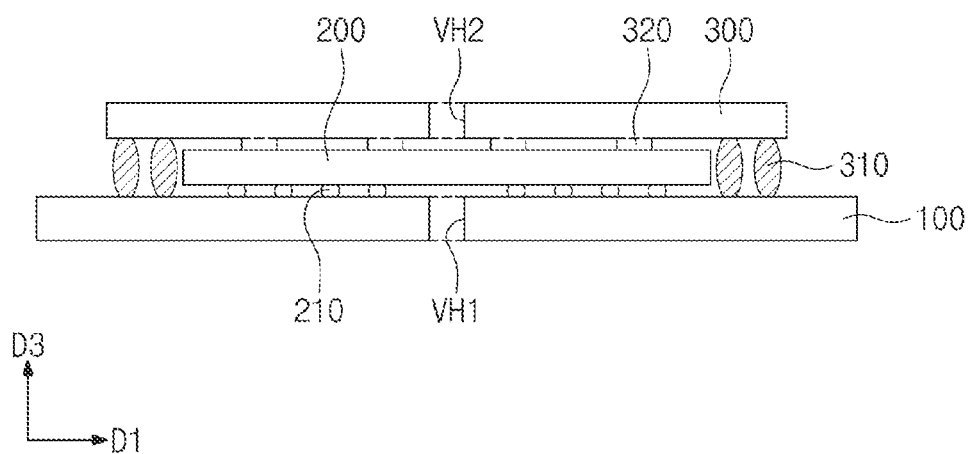
Figure 12:
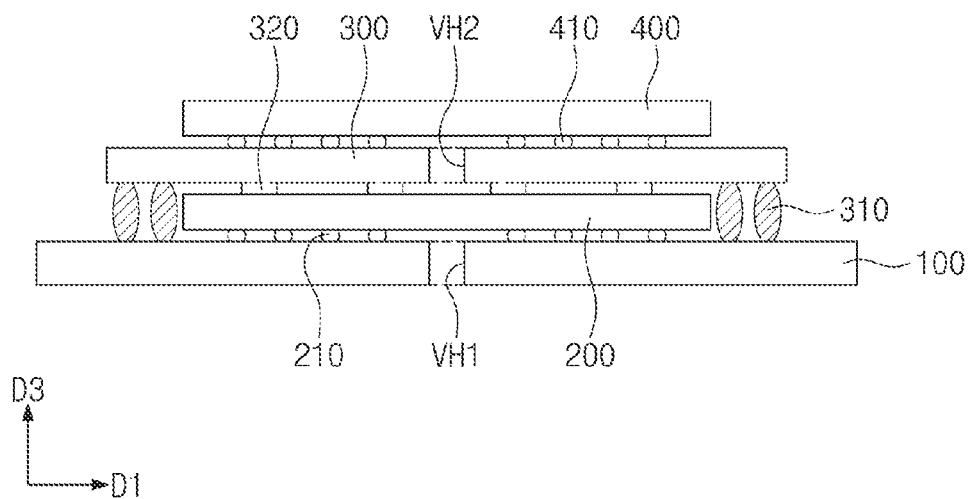
Figure 13:
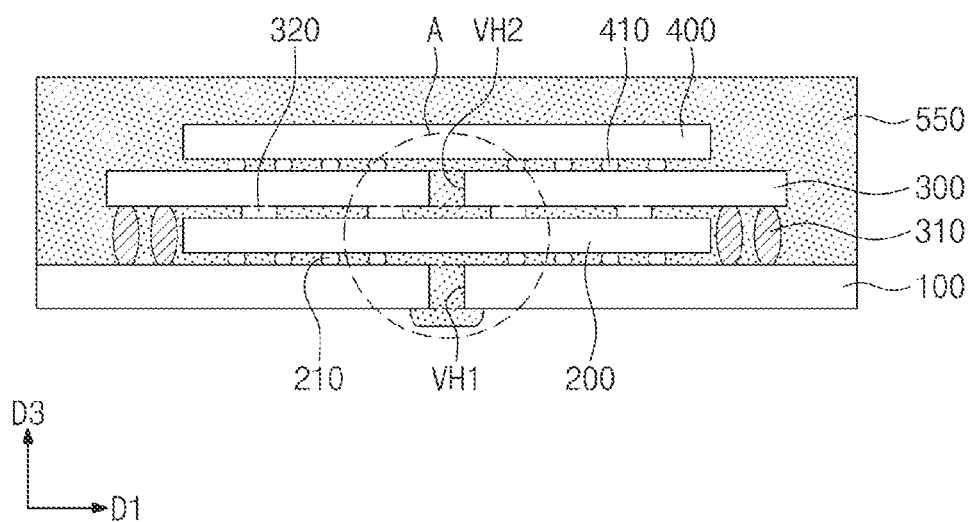
Figure 14:
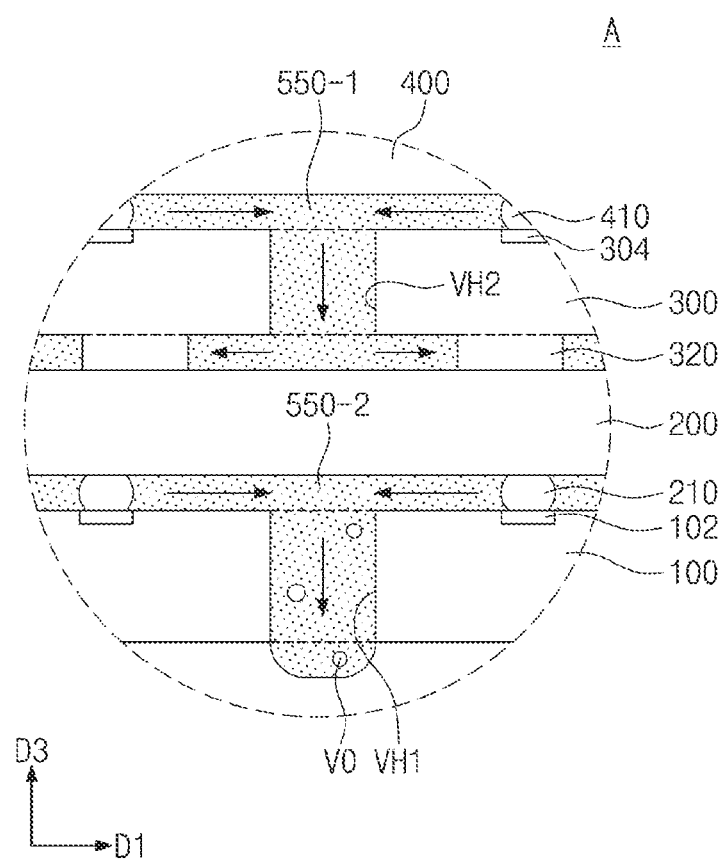

FIGS. 10, 11, 12 and 13 are related cross-sectional views illustrating a method of fabricating a semiconductor package according to embodiments of the inventive concept, and FIG. 14 is an enlarged view of section 'A' indicated in FIG. 13 further illustrating flow of molding material.

Figure 10:
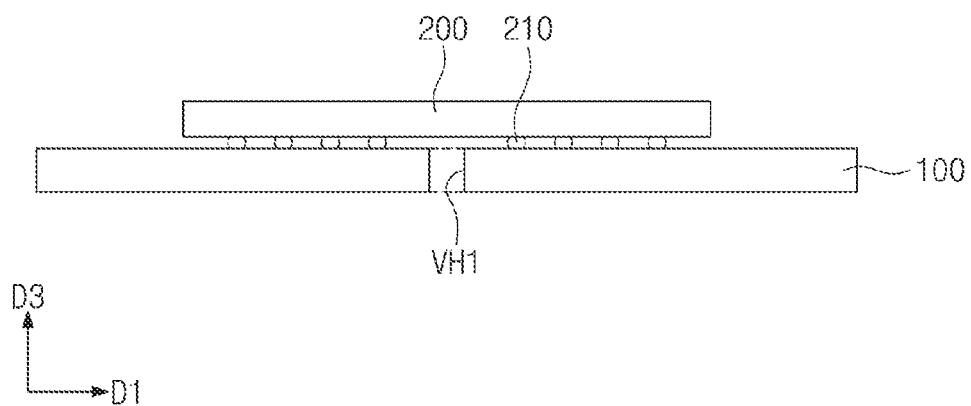
FIGS. 10, 11, 12, 13, 14, 15 and 16 are related cross-sectional views illustrating in one example a method of fabricating a semiconductor package according to embodiments of the inventive concept.

Referring to FIGS. 3, 4, and 10, the first vent hole(s) VH1 are formed in a central portion of the package substrate 100. A mechanical drilling process, for example may be used to form the first vent hole(s) VH1. Respective first vent holes VH1 may have a width of about 100 μm to about 300 μm. However, widths less than about 100 μm may impede the flow of molding material during subsequent processing.

The first semiconductor chip 200 may be mounted on the package substrate 100 before or after the formation of the first vent hole(s) VH1 using the approach(es) described in relation to FIGS. 1, 2, 3, and 4 (e.g., using first chip terminals 210).

Referring to FIGS. 3, 4, and 11, the second vent hole(s) VH2 may be centrally formed (e.g., using a mechanical drilling process) in the interposer 300 to a width of about 100 μm to about 300 μm. Here again, widths less than 100 μm may impede the flow of molding material member during subsequent processing.

The bottom surface of the interposer 300 may include the supporters 320, wherein the supporters 320 may be formed by coating the bottom surface of interposer 300 with solder resist material(s), curing the solder resist material(s), and then patterning the cured solder resist material(s) to selectively form a desired pattern of protrusions that serve as the supporters 320.

The interposer 300 may be mounted (e.g., using connection terminal 310) on the package substrate 100 in relation to the first semiconductor chip 200 and/or the second vent hole(s) VH2, as described above.

Referring to FIGS. 3, 4, and 12, the second semiconductor chip 400 may be mounted on the interposer 300 in relation to the second vent hole(s) VH2, as described above (e.g., using second chip terminals 410).

The formation of the second chip terminals 410 may involve the use of a thermocompression process, wherein potentially-damaging, downward pressure is applied to the interposer 300. However, embodiments of the inventive concept provide a number and arrangement of supporters 320 sufficient to prevent damage to the interposer 300 and/or the first semiconductor chip 200 during the mounting of the second semiconductor chip 400. Accordingly, due to an improved structure embodiments of the inventive concept are less likely to include defects (e.g., warpage, short circuits, broken connections, etc.) in the interposer 300, the connection terminals 310, the first chip terminals 210 and/or the second chip terminals 410. This outcome increases overall production yield for the semiconductor package.

Referring to FIGS. 3, 4, and 13, the molding layer 500 may be formed on the top surface of the package substrate 100 to cover at least the combination of first semiconductor chip 200, the interposer 300, and the second semiconductor chip 400.

Further, the molding material 550 used to form the molding layer 50 may be introduced to fill a space between the package substrate 100 and the first semiconductor chip 200, a space between the first semiconductor chip 200 and the interposer 300, and a space between the interposer 300 and the second semiconductor chip 400.

The enlarged view of FIG. 14 further highlights (using directional arrows) the improved introduction of molding material 550 provided by embodiments of the inventive concept. For example, a first portion of the molding material 550-1 may be introduced (e.g., injected) into the space between the interposer 300 and the second semiconductor chip 400, and may flow through the second vent hole(s) VH2 into the space between the interposer 300 and the first semiconductor chip 200.

Of note, the connection terminals 310 may hinder the flow of molding material 550-1 into the space between the interposer 300 and the first semiconductor chip 200. However, the molding material 550-1 may flow from the space between the interposer 300 and the second semiconductor chip 400 through the second vent holes VH2 and into the space between the interposer 300 and the first semiconductor chip 200.

Of further note, the presence of the supporters 320 between the interposer 300 and the first semiconductor chip 200 further facilitates the flow of molding material 550-1 between the interposer 300 and the first semiconductor chip 200. As a result, the molding material 550-1 may readily fill the space between the interposer 300 and the first semiconductor chip 200, as indicated by arrows in FIG. 14.

Of still further note, the flow rate of the molding material 550, once injected, may vary by region (or location) within the semiconductor package. For example, the flow rate of the molding material 550 may be less between the interposer 300 and the first semiconductor chip 200 than between the package substrate 100 and the first semiconductor chip 200.

In some embodiments, the molding material 550 may be introduced via multiple flow paths within the package substrate 100, thereby increasing the fill rate for the molding material 550 within respective spaces.

However, regardless of molding material introduction points it is possible that one or more spaces within the semiconductor package may not be completely filled with molding material 550. Alternately or additionally, one or voids (VO) may be formed within the molding material 550 during its introduction. More troubling in many comparative examples, there is no outwardly detectable indicator that the spaces have not been filled or that voids are present in the molding layer 500.

Embodiments of the inventive concept may provide a single-direction (e.g., top-down) or multi-directional flow of molding material 550, such that a second (e.g., a vented or overflow) part of the molding material 550-2 flows (or extrudes) from the space between the package substrate 100 and the first semiconductor chip 200 into the first vent hole(s) VH1. Therefore, even though there is an increase in filling of the molding material 550-2 in spaces between the substrates 100 and 300 and the semiconductor chips 200 and 400, the molding material 550-2 may be outwardly discharged through the first vent holes VH1, and the flow of the molding material 550-2 may be maintained in the spaces between the package substrate 100 and interposer 300 and the first and second semiconductor chips 200 and 400. Accordingly, the second part of the molding material 550-2 may easily fill the spaces between the package substrate 100 and interposer 300 and the first and second semiconductor chips 200 and 400, and voids VO may be outwardly discharged along the second part of the molding material 550-2 through the first vent holes VH1.

Referring to FIGS. 1, 3, 4, and 13, the molding material 550 may be cured to form a molding layer 500. The first part 510 of the molding layer 500 may fill the space between the package substrate 100 and the first semiconductor chip 200 and flow onto the bottom surface of the package substrate 100. A second part 520 and a third part 530 of the molding layer 500 may fill the space between the interposer 300 and the first semiconductor chip 200, as well as the space between the interposer 300 and the second semiconductor chip 400, and the second vent holes VH2.

Here, it should be noted that semiconductor packages including a molding layer that fails to fill spaces between various substrates and/or semiconductor chips and/or includes a surfeit of voids is vulnerable to external impacts. Further, any voids or gaps in an injected molding material may expand during a subsequent curing process and stress or fracture constituent layers and/or elements.

However, embodiments of the inventive concept provide the molding layer 500 that effectively fills spaces between the various substrates, interposers and semiconductor chips, and reduces voids within molding material by discharging same through a well-positioned vent hole(s). Accordingly, semiconductor packages fabricating according to methods of the inventive concept provide a markedly lower defect rate due to improved structural stability.

Referring back to FIG. 2, the external terminals 110 disposed on the bottom surface of the package substrate 100 may be protected by the presence of the presence of the first part 510 of the molding layer 500 covering the bottom surface of the package substrate 100. In this regard, the exposed first part 510 of the molding layer 500 may patterned to expose the first substrate pads 102 on the bottom surface of the package substrate 100 before formation of the external terminals 110.

Figure 15:
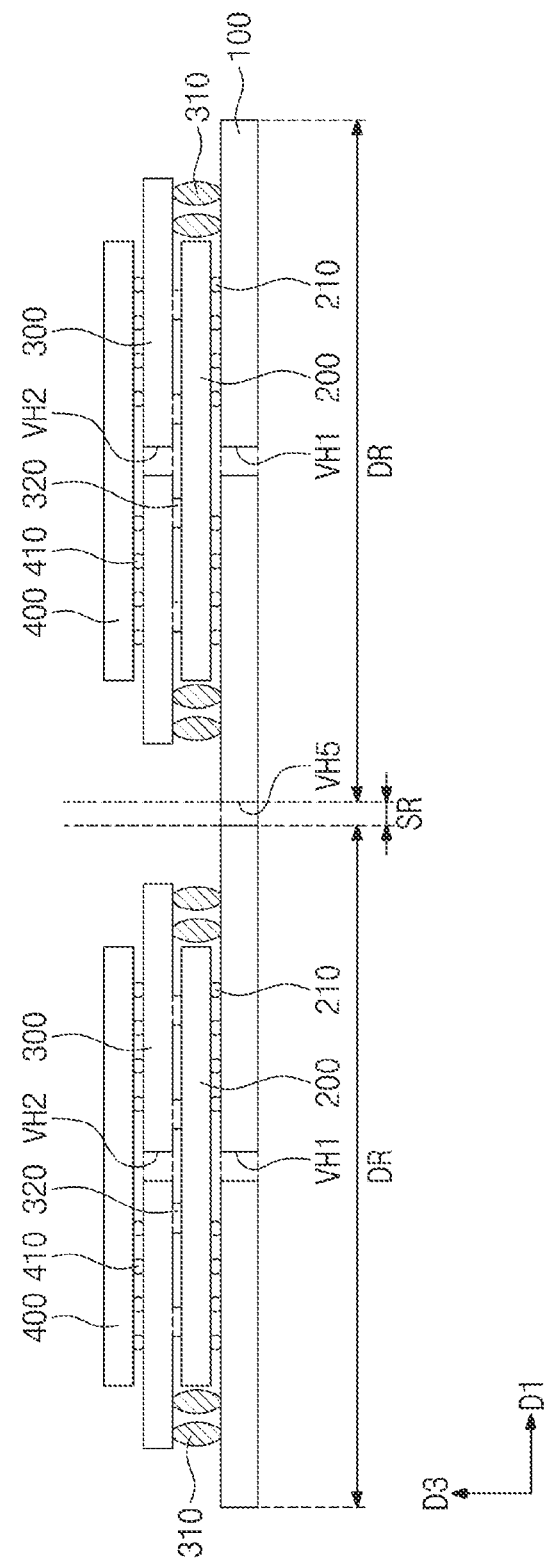
Figure 16:
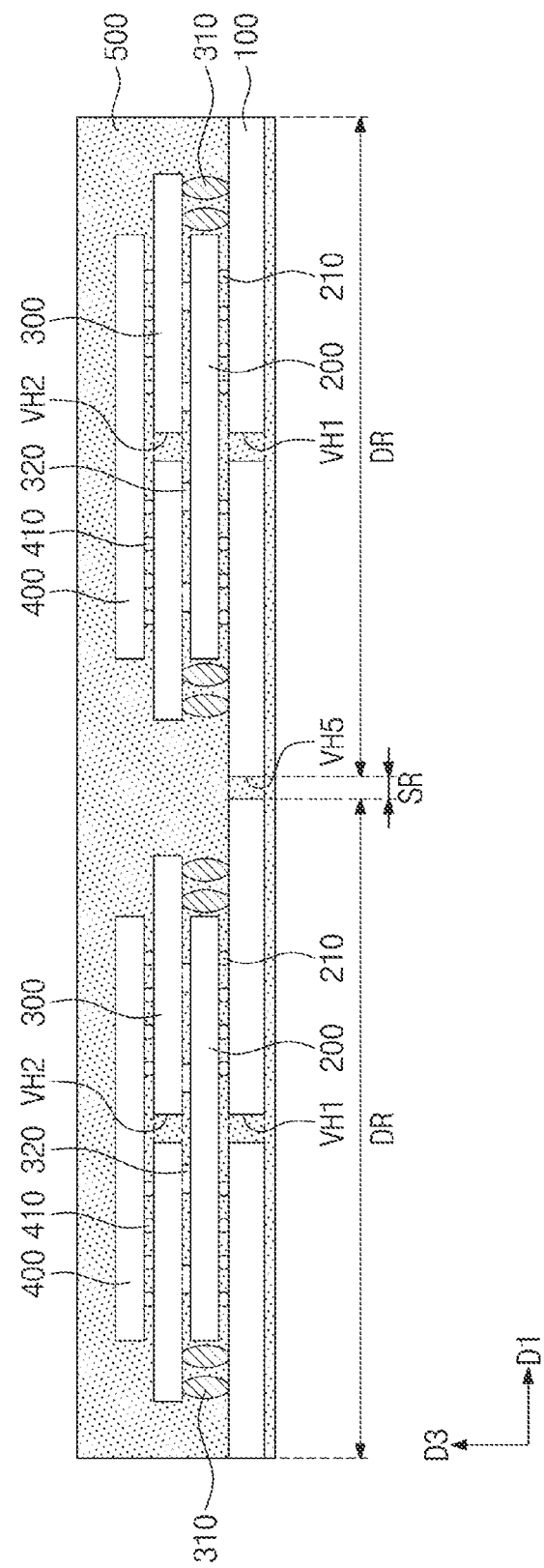

FIGS. 15 and 16 are respective cross-sectional views illustrating wafer-level processing of semiconductor packages according to embodiments of the inventive concept.

Referring to FIG. 15, each package substrate 100 disposed on the surface of a wafer may be understood as including a device region DR on which semiconductor packages are formed and a separation region SR allowing safe separation of adjacent semiconductor packages.

Thus, a fifth vent hole VH5 may be formed in the separation region SR (e.g., during the mechanical drilling process used to form the first vent holes VH1).

First semiconductor chips 200 may be mounted on respective package substrates 100 within respective device regions DR, such that each first semiconductor chips 200 is disposed over at least one of the first vent holes VH1. Afterwards, first chip terminals 210 may be used to mount the first semiconductor chips 200 on the package substrate 100.

Respective interposers 300 may be mounted on the package substrate 100 in alignment with a corresponding first semiconductor chip 200 so as to properly position supporters 320 and second vent holes VH2 in relation to the first semiconductor chips 200. Thereafter, connection terminals 310 may be used to mount the interposers 300 on the package substrate 100.

Respective second semiconductor chips 400 may be mounted on a corresponding interposer 300. That is, the second semiconductor chip 400 may be aligned with a corresponding interposer 300 so as to position the second semiconductor chip 400 over at least one of the second vent holes VH2. Thereafter, second chip terminals 410 may be used to mount the second semiconductor chips 400 on the interposer 300.

Referring to FIG. 16, the molding layer 500 may be formed on the package substrates 100. For example, a molding material may be coated over the package substrates 100 to cover the respective combinations of first semiconductor chip 200, interposer 300, and second semiconductor chip 400.

And as described above, the molding material may fill a space between the package substrate 100 and the first semiconductor chip 200, a space between the first semiconductor chip 200 and the interposer 300, and a space between the interposer 300 and the second semiconductor chip 400. That is, the molding material may be introduced into the space between the package substrate 100 and the first semiconductor chip 200, may flow from this space the first, second, third, fourth and/or fifth vent holes VH1, VH2, VH3, VH4 and VH5 onto the bottom surface of the package substrate 100.

Thereafter, the molding material may be cured to form the molding layer 500.

Once the protective molding layer 500 has been formed, a singulation process (e.g., a mechanical sawing process) may be applied to the wafer to separate semiconductor packages from each other, wherein each fifth vent hole VH5 may serve as an initial sawing point provided on the package substrate 100 to lessen the impact or stress on the package substrate 100 associated with the sawing process. That is, the combination of the completed molding layer 500 according to embodiments of the inventive concept, along with the fifth vent holes VH5 may markedly reduce the possibility of fracturing or damaging components of the respective semiconductor packages.

Thereafter, external terminals 110 may be added to the bottom surface of the package substrate 100 of each separated semiconductor package.

Semiconductor packages according to embodiments of the inventive concept may be configured such that supporters support an interposer on a semiconductor chip, thereby reducing damage (e.g., warpage) during subsequent process(es) used to mount a semiconductor chip on the interposer (e.g., solder reflow process(es)). In addition, the supporters may securely maintain a vertical separation distance between the interposer and the semiconductor chip, thereby allowing molding material to readily fill a space between the interposer and the semiconductor chip.

A method of fabricating semiconductor packages according to embodiments of the inventive concept provides a molding layer that readily fills spaces between various substrate(s), interposer(s) and semiconductor chip(s) by enabling an outward discharge of voids within constituent molding material. Accordingly, the defect rate of the resulting semiconductor packages may be reduced due to improved structural stability.

Although the inventive concept have been described in connection with some embodiments of the inventive concept illustrated in the accompanying drawings, it will be understood by one of ordinary skill in the art that variations in form and detail may be made therein without departing from the spirit and essential feature of the inventive concept. The above disclosed embodiments should thus be considered illustrative and not restrictive.

What is claimed is:

1. A semiconductor package, comprising:
    a package substrate, wherein at least one first vent hole is centrally formed in the package substrate;
    a first semiconductor chip mounted on the package substrate;
    an interposer including supporters on a bottom surface of the interposer and at least one second vent hole centrally formed in the interposer, wherein the supporters contact a top surface of the first semiconductor chip, and the interposer is electrically connected to the package substrate through connection terminals;
    a second semiconductor chip mounted on the interposer; and
    a molding layer disposed on the package substrate to cover the first semiconductor chip, the interposer, and the second semiconductor chip, wherein the molding layer fills the at least one first vent hole, the at least one second vent hole, a space between the first semiconductor chip and the interposer, and a space between the second semiconductor chip and the interposer.

2. The semiconductor package of claim 1, wherein the interposer includes a central region disposed below the second semiconductor chip and an overhang region disposed to one side of the central region,
    the at least one second vent hole and the supporters are disposed in the central region, and
    the connection terminals are disposed in the overhang region.

3. The semiconductor package of claim 1, wherein the interposer includes an elliptically-shaped central region disposed below the second semiconductor chip and a peripheral region surrounding the central region, and
    the supporters are arranged in one of a grid pattern and a honeycomb pattern.

4. The semiconductor package of claim 1, wherein each one of the supporters has a width of about 100 μm to about 300 μm, and
    supporters adjacent in horizontal direction are separated by an interval of from about 500 μm to about 1,000 μm.

5. The semiconductor package of claim 1, wherein each one of the supporters has a height of about 20 μm to about 300 μm.

6. The semiconductor package of claim 1, wherein each of the supporters is one of a cylindrical pillar and a polygonal pillar.

7. The semiconductor package of claim 1, wherein each one of the at least one first vent hole has a width of about 100 μm to about 300 μm.

8. The semiconductor package of claim 1, wherein the at least one first vent hole includes a plurality of first vent holes arranged in at least one of a first horizontal direction and a second horizontal direction.

9. The semiconductor package of claim 8, wherein the supporters are arranged in a grid including columns extending in the second horizontal direction and rows extending in the first horizontal direction, and
    the plurality of first vent holes is arranged in the second horizontal direction within the grid.

10. The semiconductor package of claim 1, wherein the interposer includes a central region disposed below the second semiconductor chip, a first overhang region disposed to one side of the central region, and an opposing second overhang region disposed to another side of the central region,
    the at least one second vent hole and the supporters are disposed in the central region, first connection terminals among the connection terminals are disposed in the first overhang region, and
    second connection terminals among the connection terminals are disposed in the second overhang region.

11. The semiconductor package of claim 10, wherein the at least one first vent hole includes a plurality of first vent holes arranged in at least one of a first horizontal direction and a second horizontal direction.

12. The semiconductor package of claim 11, wherein the supporters are arranged in the central region a first grid including columns extending in the second horizontal direction and rows extending in the first horizontal direction,
    the plurality of first vent holes is arranged in the second horizontal direction in the central region within the first grid,
    the first connection terminals are arranged in the first overhang region in a second grid including columns extending in the second horizontal direction and rows extending in the first horizontal direction, and
    the second connection terminals are arranged in the second overhang region in a third grid including columns extending in the second horizontal direction and rows extending in the first horizontal direction.

13. The semiconductor package of claim 1, wherein the molding layer surrounds the supporters disposed between the first semiconductor chip and the interposer.

14. The semiconductor package of claim 1, wherein the molding layer extends through the at least one first vent hole to cover at least a portion of a bottom surface of the package substrate.

15. The semiconductor package of claim 1, further comprising:
terminal pads disposed on a bottom surface of the package substrate;
first substrate pads disposed on a top surface of the package substrate;
second substrate pads disposed on the top surface of the package substrate;
third substrate pads disposed on a bottom surface of the interposer; and
external terminals respectively connected to the terminal pads,
wherein the first semiconductor chip is mounted on the package substrate through the first substrate pads, and each one of the connection terminals extends between a second substrate pad and a third substrate pad.

16. The semiconductor package of claim 15, wherein the at least one first vent hole includes a plurality of first vent holes extending in a horizontal direction along a central portion of the package substrate, and
the molding layer includes a first part extending from the plurality of first vent holes to form a planar-shaped island separating a first set of external terminals among the external terminals from a second set of external terminals among the external terminals.

17. The semiconductor package of claim 15, wherein the at least one first vent hole includes a plurality of first vent holes arranged in cross pattern extending in a first horizontal direction and a second horizontal pattern, and
the molding layer includes a first part extending from the plurality of first vent holes to form a cross-shaped island separating a first set of external terminals among the external terminals, a second set of external terminals among the external terminals, a third set of external terminals among the external terminals, and a fourth set of external terminals among the external terminals.

18. A semiconductor package, comprising:
a package substrate including a third vent hole centrally formed in the package substrate and a first vent hole laterally spaced apart from the third vent hole;
a first lower semiconductor chip mounted on the package substrate;
a second lower semiconductor chip mounted on the package substrate;
an interposer including first supporters on a bottom surface of the interposer contacting a top surface of the first lower semiconductor chip, second supporters on the bottom surface of the interposer contacting a top surface of the second lower semiconductor chip, and a second vent hole centrally formed in the interposer, wherein the interposer is electrically connected to the package substrate through connection terminals;
an upper semiconductor chip mounted on the interposer; and
a molding layer disposed on the package substrate to cover a combination of first lower semiconductor chip, the second lower semiconductor chip, the interposer, and the upper semiconductor chip, wherein the molding layer includes a first part filling the first vent hole, a second part filling a space between the first lower semiconductor chip and the second lower semiconductor chip and the interposer, and a third part filling a space between the upper semiconductor chip and the interposer.

19. A semiconductor package, comprising:
a package substrate including a third vent hole centrally formed in the package substrate and a first vent hole laterally spaced apart from the third vent hole;
a first lower semiconductor chip mounted on the package substrate;
a second lower semiconductor chip mounted on the package substrate;
a first interposer mounted on the package substrate, including first supporters contacting a top surface of the first lower semiconductor chip, and further including a centrally-formed second vent hole;
a second interposer laterally spaced apart from the first interposer, mounted on the package substrate, including second supporters contacting a top surface of the second lower semiconductor chip, and further including another centrally-formed second vent hole;
a first upper semiconductor chip mounted on the first interposer above the centrally-formed second vent hole;
a second upper semiconductor chip mounted on the second interposer above the another centrally-formed second vent hole; and
a molding layer disposed on the package substrate to cover a combination of first lower semiconductor chip, the second lower semiconductor chip, the first interposer, the second interposer, the first upper semiconductor chip and the second upper semiconductor chip,
wherein the molding layer includes a first part filling the third vent hole and extending to cover at least a portion of a bottom surface of the package substrate, a second part filling a space between the first lower semiconductor chip and the second lower semiconductor chip and the first interposer and the second interposer, and a third part filling a space between the first upper semiconductor chip and the first interposer and the second upper semiconductor chip and the second interposer,
the first interposer is electrically connected to the package substrate through first connection terminals disposed to one side of the first lower semiconductor, and is further electrically connected to the package substrate through second connection terminals disposed to another side of the first lower semiconductor, and
the second interposer is electrically connected to the package substrate through third connection terminals disposed to one side of the second lower semiconductor, and is further electrically connected to the package substrate through fourth connection terminals disposed to another side of the second lower semiconductor.

20. The semiconductor package of claim 19, wherein the first lower semiconductor chip and the second lower semiconductor chip are laterally separated by a gap extending in a horizontal direction, and
the second connection terminals and the third connection terminals are disposed in the gap.

* * * * *